United States Patent
Lee et al.

(10) Patent No.: US 8,816,515 B2
(45) Date of Patent: Aug. 26, 2014

(54) SEMICONDUCTOR MODULE HAVING SLIDING CASE AND MANUFACTURING METHOD THEREOF

(71) Applicant: Samsung Electro-Mechanics Co., Ltd., Suwon (KR)

(72) Inventors: Young Ki Lee, Suwon (KR); Kwang Soo Kim, Suwon (KR); Young Hoon Kwak, Suwon (KR); Sun Woo Yun, Suwon (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 13/779,502

(22) Filed: Feb. 27, 2013

(65) Prior Publication Data

US 2014/0175631 A1  Jun. 26, 2014

(30) Foreign Application Priority Data

Dec. 20, 2012  (KR) ........................ 10-2012-0149148

(51) Int. Cl.
| | | |
|---|---|---|
| H01L 23/48 | (2006.01) | |
| H01L 23/52 | (2006.01) | |
| H01L 29/40 | (2006.01) | |
| H01L 23/02 | (2006.01) | |
| H01L 23/34 | (2006.01) | |
| H01L 23/28 | (2006.01) | |
| H01L 21/44 | (2006.01) | |
| H01L 21/48 | (2006.01) | |
| H01L 21/50 | (2006.01) | |

(52) U.S. Cl.
USPC ........... 257/786; 257/685; 257/723; 257/730; 257/787; 438/107; 438/110; 438/112; 438/124; 438/666

(58) Field of Classification Search
USPC ......... 257/685, 723, 787, 790, 690, 693, 699, 257/730, 786; 438/107, 109, 110, 112, 124, 438/126, 127, 612, 666
See application file for complete search history.

(56) References Cited

U.S. PATENT DOCUMENTS

| | | | |
|---|---|---|---|
| 4,665,457 A * | 5/1987 | Odawara et al. ............... 360/133 |
| 7,812,443 B2 * | 10/2010 | Tokuyama et al. ........... 257/706 |
| 2006/0126312 A1 | 6/2006 | Kroneder | |

(Continued)

FOREIGN PATENT DOCUMENTS

| | | |
|---|---|---|
| JP | 06-169056 A | 6/1994 |
| JP | 2004-200677 A | 7/2004 |

(Continued)

OTHER PUBLICATIONS

Korean Office Action issued in Korean Application No. 10-2012-0149148 dated Jun. 12, 2014, with English Translation.

*Primary Examiner* — Matthew Reames
*Assistant Examiner* — Dilinh Nguyen
(74) *Attorney, Agent, or Firm* — McDermott Will & Emery LLP (57) ABSTRACT

There is provided a semiconductor module capable of being easily manufactured and a manufacturing method thereof, the semiconductor module including a module substrate on which at least one electronic element is mounted, at least one external connection terminal fastened to the module substrate, and a case formed by coupling a first case and a second case, wherein the first case and the second case accommodate the module substrate at both ends of the module substrate and are coupled to each other.

12 Claims, 6 Drawing Sheets

(56) References Cited

U.S. PATENT DOCUMENTS

2007/0138624 A1 6/2007 Sudo et al.
2008/0230905 A1 9/2008 Guth et al.
2008/0251909 A1 10/2008 Tokuyama et al.
2009/0021916 A1 1/2009 Stolze

FOREIGN PATENT DOCUMENTS

| JP | 2012-065544 A | 3/2012 |
| KR | 100633362 B1 | 10/2006 |
| KR | 10-2007-0065207 | 6/2007 |

* cited by examiner

SEMICONDUCTOR MODULE HAVING SLIDING CASE AND MANUFACTURING METHOD THEREOF

CROSS-REFERENCE TO RELATED APPLICATIONS

This application claims the priority of Korean Patent Application No. 10-2012-0149148 filed on Dec. 20, 2012, in the Korean Intellectual Property Office, the disclosure of which is incorporated herein by reference.

BACKGROUND OF THE INVENTION

1. Field of the Invention

The present invention relates to a semiconductor module and a manufacturing method thereof, and more particularly, to a power semiconductor module able to be easily manufactured.

2. Description of the Related Art

Recently, market demand for small, light-weight portable electronic apparatuses has rapidly increased, and thus electronic components mounted therein have also been required to be small-sized and lightweight to satisfy market demand.

Accordingly, in addition to a method of reducing a size of an electronic element itself, a method of installing as many elements and conducting wires as possible in a small defined space is an important consideration in semiconductor module design.

In addition, a large amount of heat is generated when a power semiconductor element is driven. Such heat has an influence on a lifespan and operation of an electronic product, and thus, heat dissipation of a module is also an important issue.

To this end, a power semiconductor module uses a structure in which both a power element and a control element are mounted on one surface of a circuit substrate and a heat sink used to dissipate heat is disposed on the other surface of the circuit substrate.

Such a power semiconductor module mainly uses a method of molding the exterior of the power semiconductor module with a molding member so as to externally protect the circuit substrate or elements.

However, a semiconductor module including the molding member requires a process of inserting the circuit substrate into a mold, injecting a molding material into the mold, and curing the molded material, making a manufacturing process disadvantageously complicated.

Accordingly, a semiconductor module that may be easily manufactured and a manufacturing method thereof are required.

RELATED ART DOCUMENT (Patent Document 1) Korean Patent Laid-Open Publication No. 2007-0065207

SUMMARY OF THE INVENTION

An aspect of the present invention provides a semiconductor module that is easily manufactured and a manufacturing method thereof.

Another aspect of the present invention provides a semiconductor module having a case and a manufacturing method thereof.

According to an aspect of the present invention, there is provided a semiconductor module including: a module substrate on which at least one electronic element is mounted; at least one external connection terminal fastened to the module substrate; and a case formed by coupling a first case and a second case, wherein the first case and the second case accommodate the module substrate at both ends of the module substrate and are coupled to each other.

The case may include at least one moving slit in which the external connection terminal is disposed when the first case and the second case are coupled to each other.

The moving slit may be formed to have a width corresponding to that of the external connection terminal.

The moving slit may include at least one fixing projection inwardly protruded in such a manner that a width of the moving slit is reduced, in a side thereof in which the external connection terminal is finally disposed.

One of the first case and the second case may include at least one insertion projection protruded outwardly, and the other thereof may include at least one accommodating groove into which the insertion projection is inserted.

The first case and the second case may be formed such that edges of the first case and the second case in contact with each other are engaged with each other.

The first case and the second case may include substrate accommodation parts to which the module substrate is slidably coupled.

The semiconductor module may further include: a molding unit filling an interior of the case.

The first case and the second case may be formed to have the same shape.

According to another aspect of the present invention, there is provided a semiconductor module including: a module substrate on which at least one electronic element is mounted; at least one external connection terminal fastened to the module substrate; and a case formed by accommodating the module substrate in a first case and a second case and coupling the module substrate and the first case and the second case, wherein the module substrate is inserted into the first case and the second case in a sliding manner and coupled to the first case and the second case.

According to another aspect of the present invention, there is provided a method of manufacturing a semiconductor module, the method including: mounting at least one electronic element and at least one external connection element on a module substrate; disposing a first case and a second case at both ends of the module substrate; and coupling the first case and the second case to the module substrate by moving the first case and the second case so as to contact each other.

The coupling of the first case and the second case to the module substrate may include: coupling the first case and the second case to the module substrate by inserting the module substrate into the first case and the second case in a sliding manner.

The coupling of the first case and the second case to the module substrate may include: disposing the module substrate in substrate accommodation parts formed in the first case and the second case and disposing the external connection terminal in the moving slit formed in the first case and the second case.

The method may further include: forming a molding unit by filling an interior of the case with a molding material.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 1:
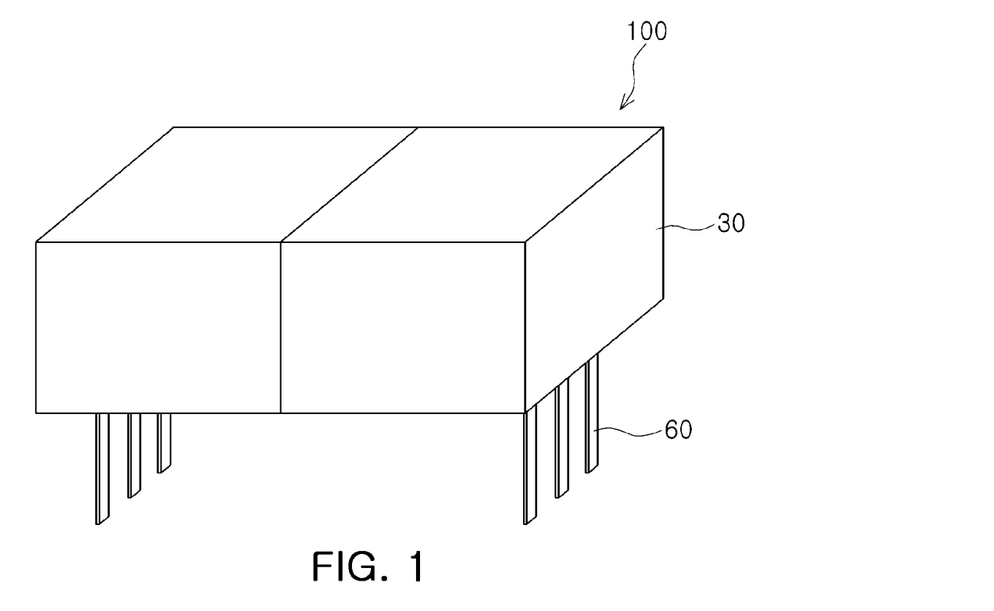
FIG. 1 is a schematic perspective view of a semiconductor module according to an embodiment of the present invention.
Figure 2:
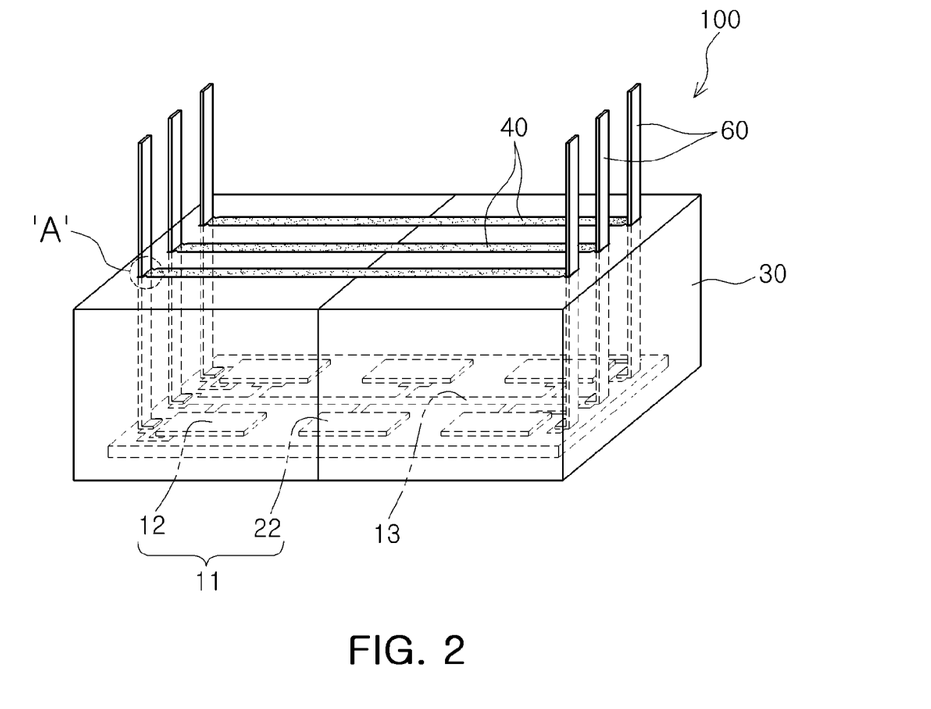
FIG. 2 is a bottom perspective view of the semiconductor module of FIG. 1.
Figure 3:
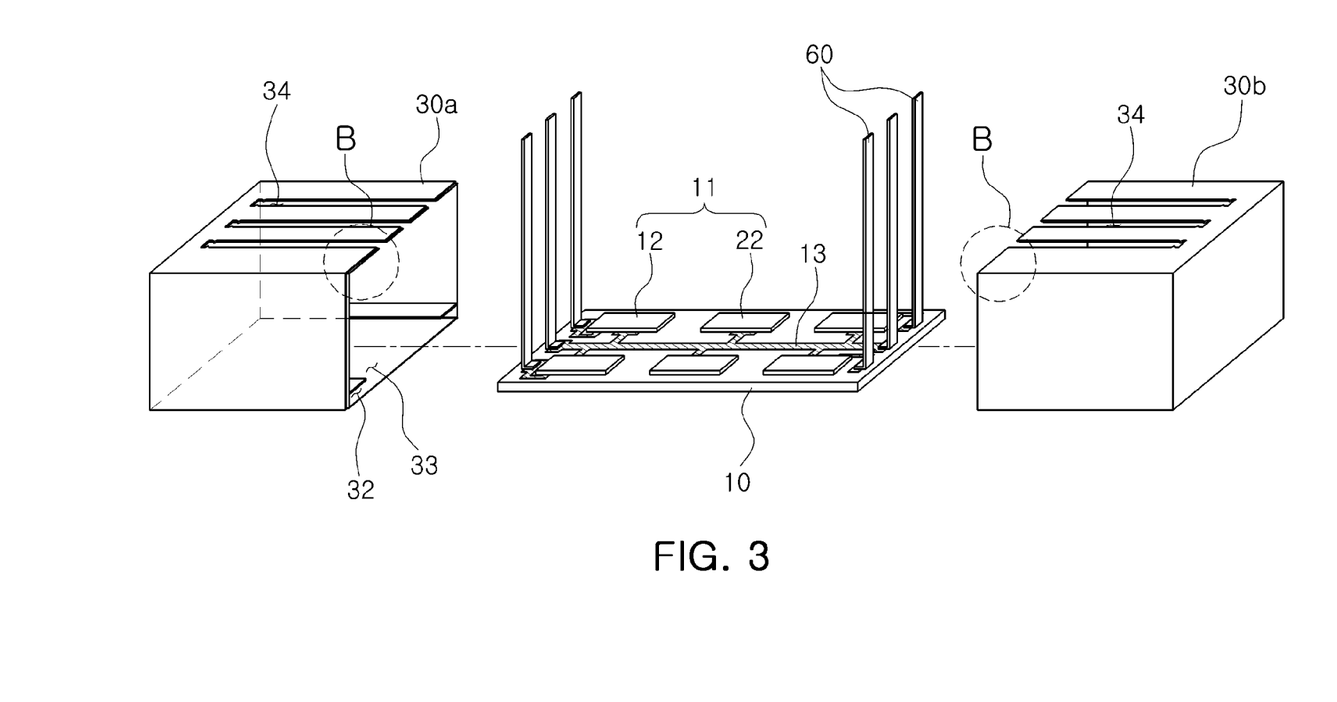
FIG. 3 is an exploded perspective view of the semiconductor module of FIG. 2.

FIG. 1 is a schematic perspective view of a semiconductor module according to an embodiment of the present invention. FIG. 2 is a bottom perspective view of the semiconductor module of FIG. 1. FIG. 3 is an exploded perspective view of the semiconductor module of FIG. 2.

Figure 4:
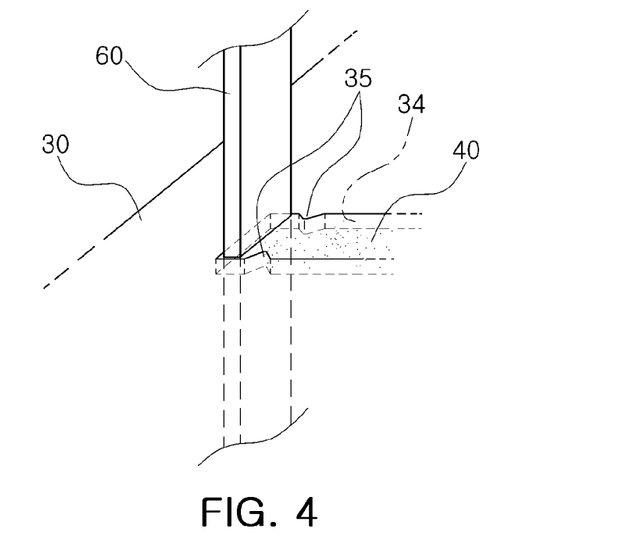
FIG. 4 is an enlarged view of portion A of FIG. 2.
Figure 5:
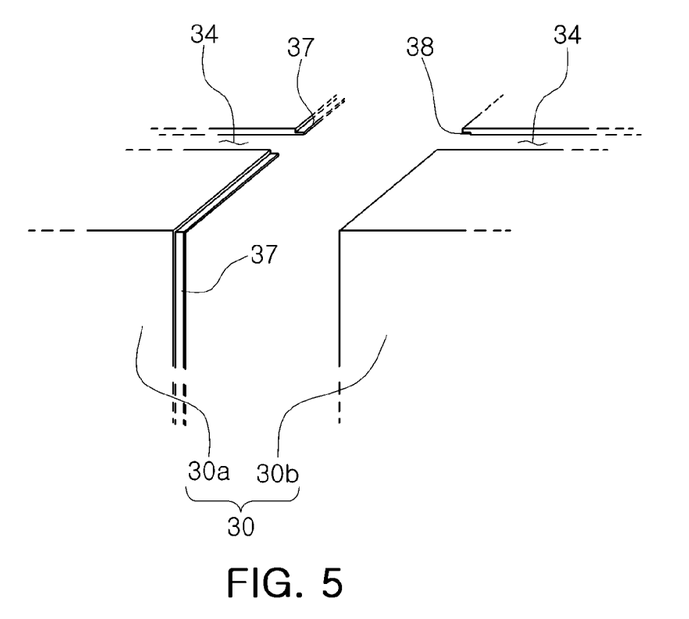
FIG. 5 is an enlarged view of portion B of FIG. 3.

FIG. 4 is an enlarged view of portion A of FIG. 2. FIG. 5 is an enlarged view of portion B of FIG. 3.

Referring to FIGS. 1 through 5, a semiconductor module 100 according to an embodiment of the present invention may include a module substrate 10, electronic elements 11, external connection terminals 60, and a case 30.

The module substrate 10 may be a printed circuit board (PCB), a ceramic substrate, a pre-molded substrate, a direct bonded copper (DBC) substrate, or an insulated metal substrate (IMS).

A mounting electrode (not shown) used to mount the electronic elements 11 to later be described or a wire pattern 13 used to electrically connect the mounting electrodes may be formed on the module substrate 10.

The wire pattern 13 may use a general layer forming method, for example, chemical vapor deposition (CVD) and physical vapor deposition (PVD) or may be formed by electrolysis plating or electroless plating. Also, the wire pattern 13 may include a conductive material such as metal. For example, the wire pattern 13 may include aluminum, an aluminum alloy, copper, a copper alloy, or a combination thereof.

One or more electronic elements 11 may be mounted on one surface of the module substrate 10.

The electronic elements 11 according to the present embodiment may include power elements 12 and control elements 13.

The power elements 12 may be power circuit elements for power conversion to control power, or power control, such as a servo driver, an inverter, a power regulator, a converter, and the like.

For example, the power elements 12 may include power MOSFETs, bipolar junction transistors (BJTs), insulated-gate bipolar transistors (IGBTs), diodes, or a combination thereof. That is, in the present embodiment, the power elements 12 may include all or a portion of the elements.

In particular, a plurality of pairs of the power elements 12 may be configured, each pair of the power elements 12 may include an IGBT and a diode, according to the embodiment of the present invention. However, this is merely provided by way of example, and the present invention is not necessarily limited thereto.

The control elements 22 may be electrically connected to the power elements 12 through the wire pattern 13 or a bonding wire (not shown), thereby controlling operations of the power elements 12.

The control elements 22 may be, for example, microprocessors, and may further include passive elements such as a resistor, an inverter, or a condenser, or active elements such as a transistor.

Meanwhile, a single control element 22 or a plurality of the control elements 22 may be provided for a single power device 12. That is, types and amounts of the control devices 22 may be appropriately selected depending on types of and amounts of the power devices 12.

In a case in which the electronic devices 11 are electrically connected to the module substrate 10 through the bonding wire, the electronic elements 11 may be attached to one surface of the module substrate 10 by a bonding member (not shown). In this regard, the bonding member may be conductive or non-conductive. For example, the bonding member may be formed by using a conductive solder, a conductive paste, or a tape. Also, a solder, metal epoxy, a metal paste, resin-based epoxy, or a bonding tape having excellent heat resistance, or the like may be used as the bonding member.

However, the construction of the present invention is not limited thereto. The electronic elements 11 and the module substrate 10 may be electrically connected using various methods such as flip chip bonding, a solder ball method, or the like, if necessary.

The external connection terminals 60 include a plurality of leads that may be classified as external leads connected to an external substrate (not shown) and internal leads connected to the module substrate 10. That is, the external leads may indicate a part exposed to the outside of the case 30, and the internal leads may indicate apart disposed within the case 30.

Meanwhile, an example of a case in which the external connection terminals 60 and the electronic elements 11 are electrically connected to each other through the wire pattern 13 formed on the module substrate 10 is described in the present embodiment, but the present invention is not limited thereto. The external connection terminals 60 and the electronic elements 11 are connected using various methods such as using the bonding wire if necessary.

The external connection terminals 60 may be formed of a material such as copper (Cu) or aluminum (Al), but the present invention is not limited thereto.

A molding unit 40 may seal the module substrate 10 and the electronic elements 11 in such a manner as to fill the inner space of the case 30 that will later be described. That is, the molding unit 40 is formed to cover and seal the electronic elements 11 and the internal leads of the external connection terminals 60 bonded to the module substrate 10 to thereby protect the electronic elements 11 from an external environment. Also, the molding unit 40 surrounds the electronic elements 11 to fix the electronic elements 11 therein, thereby safely protecting the electronic elements 11 from an external impact.

The molding unit 40 may be formed of an insulating material such as resin or the like. In particular, a material having high thermal conductivity such as a silicon gel, a thermally conductive epoxy, a polyimide, etc. may be used.

Meanwhile, in a case in which the electronic elements 11 and the module substrate 10 can only be protected by using the case 30 that will later be described, the molding unit 40 according to the present embodiment may be omitted. That is, the molding unit 40 may be added or omitted if necessary.

The case 30 forms an overall exterior of the semiconductor module 100 and protects the electronic elements 11 and the module substrate 10 from the external environment.

The case 30 according to the present embodiment may be coupled to the module substrate 10 at both ends of the module substrate 10. To this end, the case 30 may include a first case 30a and a second case 30b.

The first case 30a and the second case 30b may have the same shapes symmetrically with respect to each other, disposed at both ends of the module substrate 10 to face each other, and coupled to each other. As the first case 30a and the second case 30b are coupled to each other, an accommodation space for accommodating the electronic elements 11 and the module substrate 10 therein is formed in the case 30.

The case 30 accommodates the electronic elements 11 and the module substrate 10 therein and concurrently fixes the module substrate 10 in the case 30. To this end, the case 30 according to the present embodiment may include substrate accommodation units 32 and moving slits 34.

The substrate accommodation units 32 may be formed as a space in which the module substrate 10 is inserted and fixed.

The module substrate 10 according to the present embodiment is inserted into the substrate accommodation units 32 in a sliding manner and coupled to the case 30. Thus, the substrate accommodation units 32 may be formed as a space having a size corresponding to an exterior (for example, a length and a thickness) of the module substrate 10 in such a manner that the module substrate 10 may be slidably coupled to the substrate accommodation units 32.

The substrate accommodation units 32 may be respectively formed in the first case 30a and the second case 30b and may include opening units 33 each having a partially open surface. The opening units 33 are used as spaces in which the electronic elements 11 are disposed. Thus, the electronic elements 11 mounted on the module substrate 10 and protruded toward one side of the module substrate 10 may be disposed in such a manner as to pass through the opening units 33, and thus the electronic elements 11 may be easily disposed in the case 30.

The moving slits 34 may be formed as spaces in which the external connection terminals 60 of the module substrate 10 are inserted. Thus, the moving slits 34 are formed in a lower surface of the case 30 in which the external connection terminals 60 are disposed. Also, the number of the moving slits 34 may be identical to the number of the external connection terminals 60.

The moving slits 34 are formed in the respective first case and second case 30a and 30b to have a symmetrical structure in the present embodiment. This is because of the structure in which all the external connection terminals 60 are disposed in both ends of the first case 30a and the second case 30b. Thus, the structure of the present invention is not limited thereto. The moving slits 34 may be formed in one of the first case 30a and the second case 30b according to a disposition structure of the external connection terminals 60 or may be formed to have a non-symmetrical structure.

The moving slits 34 are used as paths through which the external connection terminals 60 move toward the side of the case 30 when the case 30 and the module substrate 10 are coupled to each other. Thus, a width of the moving slits 34 may be the same as or slightly greater than a width of the external connection terminals 60. Also, the moving slits 34 are formed lengthwise along the movement paths of the external connection terminals 60.

Also, at least one fixing projection 35 may be formed in a side of each moving slit 34, i.e., in a side in which the external connection terminals 60 are finally disposed.

The fixing projection 35 may be inwardly protruded in such a manner that the width of each moving slit 34 is reduced. An example of a case in which the two fixing projections 35 are formed to face each other in each moving slit 34 is described in the present embodiment. However, the present invention is not limited thereto. Various modifications including formation of a single fixing projection 35 in each moving slit 34 may be possible if necessary.

The fixing projection 35 may be provided to fix each external connection terminal 60 disposed in a side of the moving slit 34. That is, if the external connection terminal 60 is disposed in a side of the moving slit 34 as the case 30 and the module substrate 10 are coupled to each other, the movements of the external connection terminal 60 may be restricted by the fixing projection 35.

If an external force is applied to the external connection terminal 60 in a state in which the fixing projection 35 is not formed, the external force is applied to a bonding portion of the external connection terminal 60 and the module substrate 10. Thus, in this case, the bonding portion may be easily damaged.

However, in a case in which the movements of the external connection terminal 60 is fixed by using the fixing projection 35 as in the present embodiment, the external force applied to the external connection terminal 60 is applied to the external connection terminal 60 and the fixing projection 35, thereby preventing the bonding portion from being damaged.

Also, the case 30 according to the present embodiment may be formed by coupling the first case 30a and the second case 30b to each other by insertion binding. As shown in FIG. 5, the semiconductor module 100 according to the present embodiment may be configured in such a manner that an insertion projection 37 is formed in the first case 30a, an accommodation groove 38 is formed in the second case 30b, and the insertion projection 37 of the first case 30a is inserted into the accommodation groove 38 in the second case 30b to be fitted therein. Accordingly, the case 30 and the module substrate 10 may be fixed and coupled to each other merely by binding without a separate fixing member.

Figure 6:
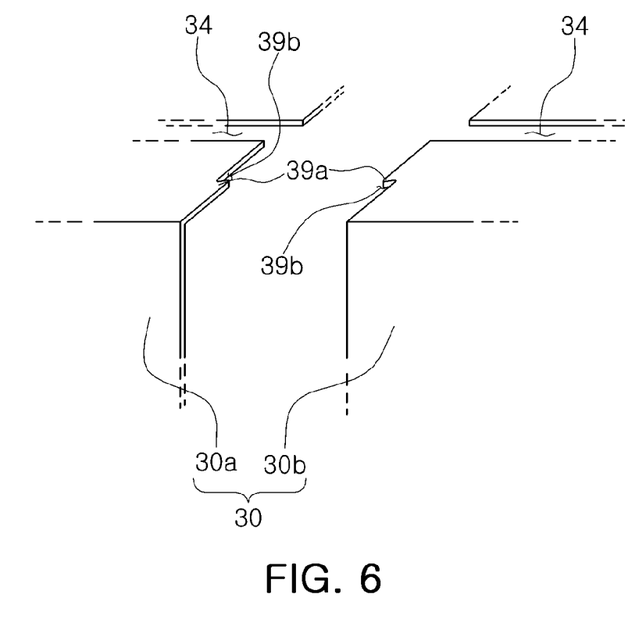
FIG. 6 is a view illustrating a case binding structure according to another embodiment of the present invention.

However, the configuration of the present invention is not limited thereto, and may be modified in various manners as shown in FIG. 6 in order to increase binding force.

FIG. 6 is a view illustrating a case binding structure according to another embodiment of the present invention. Referring to FIG. 6, the first case 30a and the second case 30b may include protrusions 39a and grooves 39b corresponding to the protrusions 39a and are symmetrically with respect to each other and engaged with each other. The protrusions 39a and the grooves 39b corresponding thereof are coupled to each other in such a manner as to be engaged with each other, such that the first case 30a and the second case 30b are fixedly coupled to each other.

In this case, binding force between the first case 30a and the second case 30b may be increased.

Also, the first case 30a and the second case 30b may be fixed and coupled to each other by using a separate fixing member such as a screw or may be integrally formed by bonding the first case 30a and the second case 30b to each other using a bonding member disposed therebetween. In this regard, a bonding agent or a bonding tape may be used as the bonding member.

The case 30 according to the present embodiment may be formed of an insulating material. That is, polyphenylene sulfide (PPS), liquid polyester (LCP), polybutyleneterephthalate (PBT), polyethylene terephthalate (PET), phenol based resin, or the like may be used as the material of the case 30 but the present invention is not limited thereto. For example, various applications including formation of the interior of the case 30 by using a metal material and then coating the exterior thereof by using the insulating material may be possible, if necessary.

Meanwhile, although not shown, the semiconductor module 100 according to the present embodiment may further include a heat dissipation unit outside of the case 30. The heat dissipation unit may be fastened to at least one of external surfaces of the case 30 to dissipate heat generated from the electronic elements 11 to the outside.

The heat dissipation unit may be a heat sink formed of a metal capable of effectively dissipating heat to the outside. Aluminum (Al) or an aluminum alloy that can be easily used at a relatively low cost as well as has excellent heat conductive characteristics may be used as the material of the heat dissipation unit. However, the present invention is not limited thereto. A material having the excellent heat conductive characteristics may be used in various ways even in the case that the material is not metal, such as a material like graphite.

Also, a plurality of projections or slits may be formed outside the heat dissipation unit so as to expand an external area.

Next, a method of manufacturing a semiconductor module according to the present embodiment will now be described.

Figure 7:
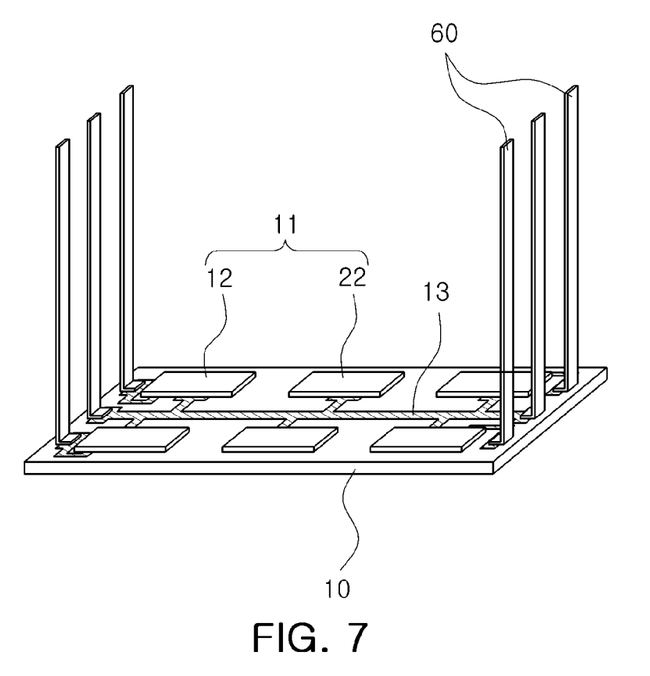
FIGS. 7 through 9 are views illustrating a method of manufacturing a semiconductor module according to an embodiment of the present invention.
Figure 8:
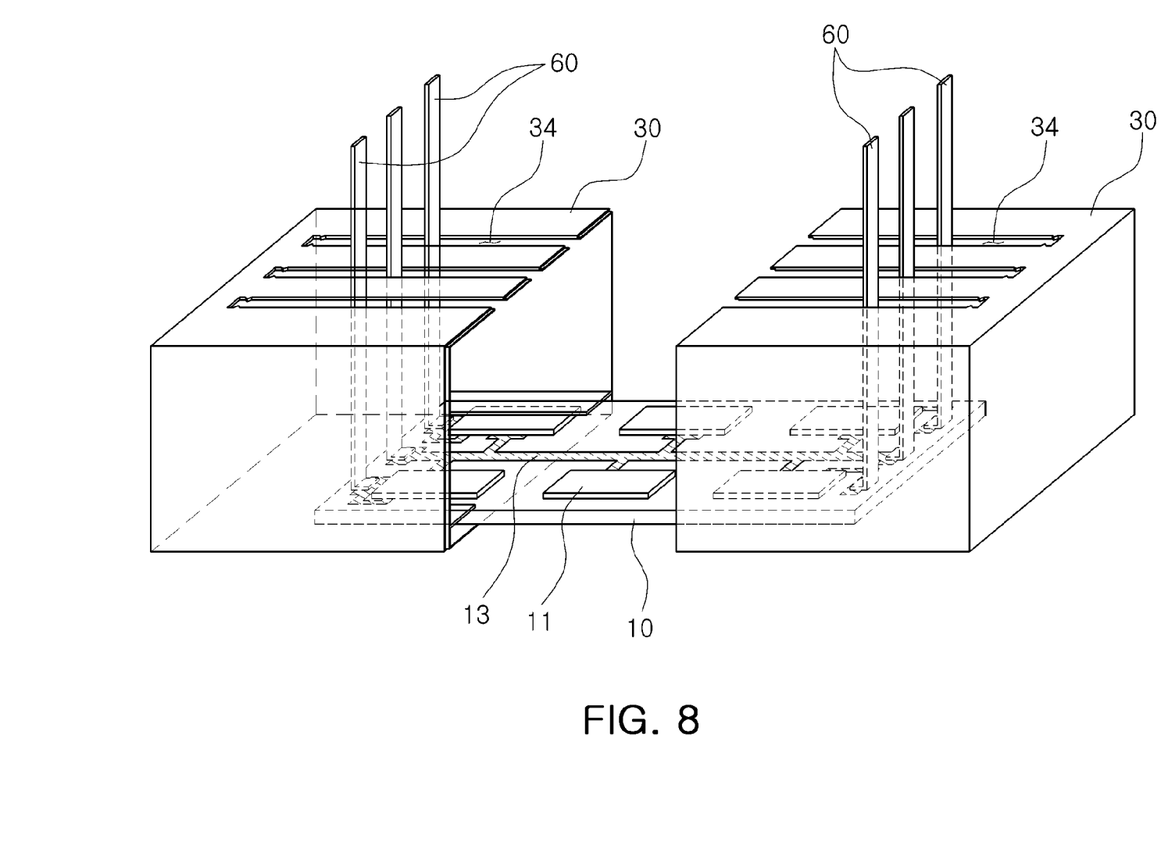
Figure 9:
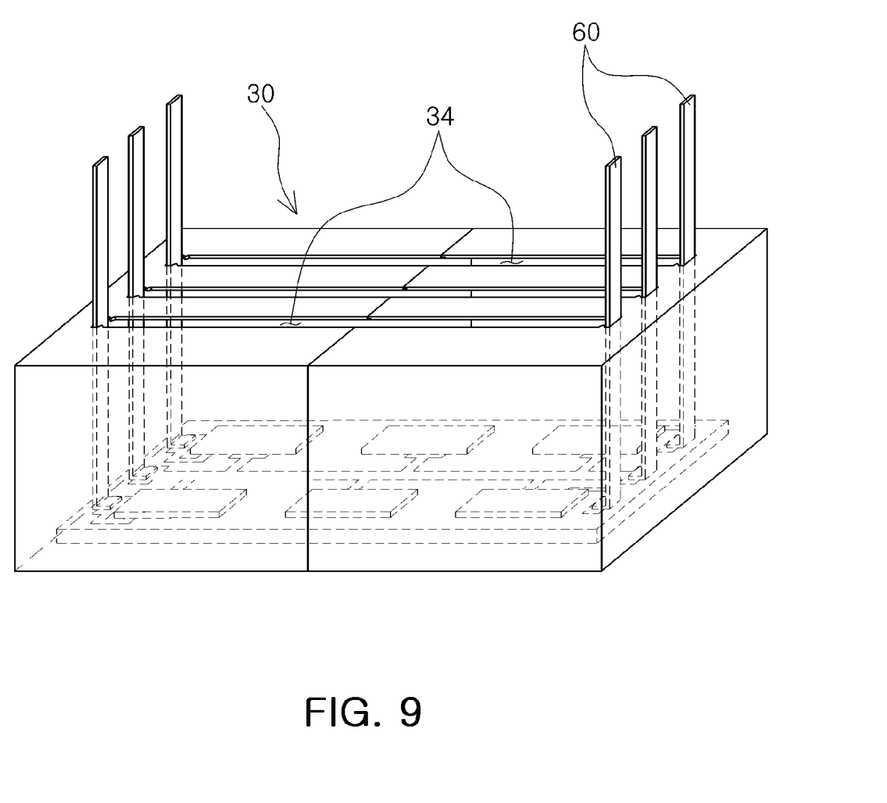

FIGS. 7 through 9 are views illustrating a method of manufacturing a semiconductor module according to an embodiment of the present invention.

Referring to FIGS. 7 through 9, in the method of manufacturing the semiconductor module according to the present embodiment, the electronic elements 11 and the external connection terminals 60 are mounted on the module substrate 10 as shown in FIG. 7.

Next, as shown in FIG. 8, the first case 30a and the second case 30b are disposed at both ends of the module substrate 10 on which the electronic elements 11 and the external connection terminals 60 are mounted. In this regard, the module substrate 10 may be inserted into the substrate accommodation units 32 of the first case 30a and the second case 30b, and the external connection terminals 60 may be inserted into the moving slits 34.

Thereafter, as shown in FIG. 8, the first case 30a and the second case 30b move toward the center thereof in such that the first case 30a and the second case 30b may be coupled to each other. If the first case 30a and the second case 30b contact each other, the insertion projection 37 of the first case 30a is inserted into the accommodation groove 38 in the second case 30b, and, as shown in FIG. 9, the first case 30a and the second case 30b may be fixed and coupled to each other.

During this process, the module substrate 10 is accommodated in and coupled to the substrate accommodation units 32 of the first case 30a and the second case 30b in a sliding manner. Thus, the module substrate 10 may be fixed and coupled to the case 30 only through the process of coupling the first case 30a and the second case 30b to each other without a separate fixing member or process.

Thereafter, the molding unit 40 is formed by filling the inside of the case 30 with a molding material. This process may be performed through a process of injecting a liquid molding material into the inside of the case 30 through the moving slits 34 and then curing the liquid molding material.

A process of coupling the heat dissipation unit to the outside of the case 30 may be further performed if necessary. The semiconductor module 100 according to the present embodiment as shown in FIGS. 1 and 2 may be completely manufactured.

As set forth above, the above-configured semiconductor module and the manufacturing method thereof according to embodiments of the present invention completely form a single case by accommodating a module substrate in a first case and a second case at both sides of the module substrate and coupling the module substrate and the first and second cases. In this regard, external connection terminals may be easily disposed in the case by using moving slits of the case, and the module substrate may be coupled to the case in a sliding manner.

Therefore, the module substrate and the case may be very easily coupled to each other, and thus the semiconductor module can be advantageously manufactured easily. Also, a variety of semiconductor modules having external connection terminals, i.e. lead frames, can be easily applied.

In addition, in the semiconductor module according to the present invention, the molding unit may be omitted if necessary, and the exterior of the semiconductor module may be formed only using the case, and thus a conventional process of forming the molding unit can be omitted. Thus, a manufacturing processing can be simplified.

The above-described semiconductor module and the manufacturing method thereof according to embodiments of the present invention are not limited to the above-described embodiments and may have various applications. For example, although an example of a case in which the case of the semiconductor module is generally formed in a rectangular shape in the above-described embodiments, the present invention is not limited thereto. That is, the case may be formed in various shapes such as a cylindrical shape or a polygonal shape if necessary.

While the present invention has been shown and described in connection with the embodiments, it will be apparent to those skilled in the art that modifications and variations can be made without departing from the spirit and scope of the invention as defined by the appended claims.

What is claimed is:

1. A semiconductor module comprising:
    a module substrate on which at least one electronic element is mounted;
    at least one external connection terminal fastened to the module substrate; and
    a case formed by coupling a first case and a second case, wherein:
    the first case and the second case accommodate the module substrate at both ends of the module substrate and are coupled to each other,
    the case includes at least one moving slit in which the external connection terminal is disposed when the first case and the second case are coupled to each other, and
    the moving slit includes at least one fixing projection inwardly protruded in such a manner that a width of the moving slit is reduced, in a side thereof in which the external connection terminal is finally disposed.

2. The semiconductor module of claim 1, wherein the moving slit is formed to have a width corresponding to that of the external connection terminal.

3. The semiconductor module of claim 1, wherein one of the first case and the second case includes at least one insertion projection protruded outwardly, and the other thereof includes at least one accommodating groove into which the insertion projection is inserted.

4. The semiconductor module of claim 1, wherein the first case and the second case are formed such that edges of the first case and the second case in contact with each other are engaged with each other.

5. The semiconductor module of claim 1, wherein the first case and the second case include substrate accommodation parts to which the module substrate is slidably coupled.

6. The semiconductor module of claim 1, further comprising a molding unit filling an interior of the case.

7. The semiconductor module of claim 1, wherein the first case and the second case are formed to have the same shape.

8. A semiconductor module comprising:
a module substrate on which at least one electronic element is mounted;
at least one external connection terminal fastened to the module substrate; and
a case formed by accommodating the module substrate in a first case and a second case and coupling the module substrate and the first case and the second case, wherein:
the module substrate is inserted into the first case and the second case in a sliding manner and coupled to the first case and the second case,
the case includes at least one moving slit in which the external connection terminal is disposed when the first case and the second case are coupled to each other, and
the moving slit includes at least one fixing projection inwardly protruded in such a manner that a width of the moving slit is reduced, in a side thereof in which the external connection terminal is finally disposed.

9. A method of manufacturing a semiconductor module, the method comprising:
mounting at least one electronic element and at least one external connection element on a module substrate;
disposing a first case and a second case at both ends of the module substrate; and
coupling the first case and the second case to the module substrate by moving the first case and the second case so as to contact each other, wherein:
the first case and the second case include at least one moving slit in which the external connection terminal is disposed when the first case and the second case are coupled to each other, and
the moving slit includes at least one fixing projection inwardly protruded in such a manner that a width of the moving slit is reduced, in a side thereof in which the external connection terminal is finally disposed.

10. The method of claim 9, wherein the coupling of the first case and the second case to the module substrate includes: coupling the first case and the second case to the module substrate by inserting the module substrate into the first case and the second case in a sliding manner.

11. The method of claim 9, wherein the coupling of the first case and the second case to the module substrate includes: disposing the module substrate in substrate accommodation parts formed in the first case and the second case and disposing the external connection terminal in the moving slit formed in the first case and the second case.

12. The method of claim 9, further comprising forming a molding unit by tilling an inside of the case with a molding material.

* * * * *